(12) United States Patent
Seibert

(10) Patent No.: US 7,881,905 B2
(45) Date of Patent: Feb. 1, 2011

(54) METHOD FOR AMBIGUITY RESOLUTION IN LOCATION DETERMINATION

(75) Inventor: Cristina Seibert, Mountain View, CA (US)

(73) Assignee: QUALCOMM Incorporated, San Diego, CA (US)

(\*) Notice: Subject to any disclaimer, the term of this patent is extended or adjusted under 35 U.S.C. 154(b) by 233 days.

(21) Appl. No.: 11/034,705

(22) Filed: Jan. 12, 2005

(65) Prior Publication Data

US 2006/0106573 A1 May 18, 2006

Related U.S. Application Data

(60) Provisional application No. 60/629,011, filed on Nov. 17, 2004.

(51) Int. Cl.
*G06F 17/18* (2006.01)
(52) U.S. Cl. .................................................. 702/181
(58) Field of Classification Search ................... 702/181
See application file for complete search history.

(56) References Cited

U.S. PATENT DOCUMENTS

| | | | |
|---|---|---|---|
| 5,293,642 A | | 3/1994 | Lo |
| 5,623,414 A | \* | 4/1997 | Misra .......................... 701/207 |
| 5,740,048 A | \* | 4/1998 | Abel et al. .................... 701/200 |
| 6,114,992 A | \* | 9/2000 | Underbrink ............ 342/357.15 |
| 6,249,252 B1 | | 6/2001 | Dupray |

(Continued)

FOREIGN PATENT DOCUMENTS

| | | |
|---|---|---|
| EP | 0420338 | 4/1991 |
| EP | 1445970 | 8/2004 |
| RU | 2060513 C1 | 5/1996 |
| RU | 2098297 C1 | 12/1997 |

(Continued)

OTHER PUBLICATIONS

International Search Report—PCT/US05/041847—International Search Authority—European Patent Office—Aug. 11, 2006.

(Continued)

*Primary Examiner*—Tung S Lau
(74) *Attorney, Agent, or Firm*—Arnold J. Gum

(57) ABSTRACT

A method using various heuristics techniques for resolving ambiguity in location determination in environments with or without noise. A final location determination solution may be determined from a set of ambiguous location determination solutions by using clock temporal bias value, by using consistency information of ranging signal order such as the time of arrival and/or the received power level of the ranging signals, by using the distances to the sources, and/or by using other discriminator functions to select the final location determination solution from a plurality of ambiguous location determination solutions. The main advantage of the heuristic approaches is that redundant measurements are not required for location determination solution disambiguation.

17 Claims, 8 Drawing Sheets

U.S. PATENT DOCUMENTS

| | | |
|---|---|---|
| 6,263,208 B1 | 7/2001 | Chang et al. |
| 6,289,280 B1 | 9/2001 | Fernandez-Corbaton et al. |
| 6,496,701 B1 | 12/2002 | Chen et al. |
| 6,542,121 B1* | 4/2003 | Beale et al. ............... 342/442 |
| 6,564,065 B1* | 5/2003 | Chang et al. ............... 455/457 |
| 6,889,053 B1* | 5/2005 | Chang et al. ............. 455/456.3 |
| 2001/0022558 A1 | 9/2001 | Karr, Jr. et al. |
| 2003/0119496 A1* | 6/2003 | Gaal et al. ............... 455/424 |

FOREIGN PATENT DOCUMENTS

| | | |
|---|---|---|
| RU | 2152050 C1 | 6/2000 |
| RU | 2161317 C1 | 12/2000 |
| SU | 1309747 | 9/1999 |
| WO | WO03058986 A2 | 7/2003 |

OTHER PUBLICATIONS

Written Opinion—PCT/US05/041847—International Search Authority—European Patent Office—Aug. 11, 2006.

International Preliminary Report on Patentability—PCT/US05/041847—International Search Authority—The International Bureau of WIPO—May 22, 2007.

* cited by examiner

METHOD FOR AMBIGUITY RESOLUTION IN LOCATION DETERMINATION

RELATED APPLICATIONS

This application claims priority to U.S. Provisional Patent Application No. 60/629,011, filed on Nov. 17, 2004.

BACKGROUND

1. Field

The disclosed subject matter relates generally to methods for location determination, and more particularly to methods using various heuristics techniques for resolving ambiguity in location determination in environments with or without noise.

2. Background

In range-based location determination systems, measurements of ranging signals from a plurality of sources are converted to distance information associated with the source of each ranging signal. Distances to different sources with known locations are combined to solve for the unknown user location via geometric techniques known, for example as trilateration (a.k.a. triangulation). If delay of ranging signals cannot be known reliably (e.g. in asynchronous systems where the user clock is not synchronized to the network), location determination algorithms may treat user clock temporal bias as another unknown, to be solved for by the trilateration process, using an additional measurement.

However, a location determination system is ambiguous if more than one location determination solution set of user coordinates and clock temporal bias is consistent with a set of distance measurements. Location determination systems can produce ambiguous location determination solutions in three distinct ways: first, ambiguity can be caused by insufficient measurements; second, ambiguity may be introduced by the properties of the algorithm employed in location determination; and third, ambiguity may be introduced by the presence of noisy measurements.

First, a system has an insufficient number of measurements when the number of unknowns is greater than or equal to the number of independent measurements. For example, consider the case where the unknowns are the two-dimensional user spatial coordinates and user clock temporal bias. Consider the case depicted in FIG. 1. There are three unknowns, namely the mobile station latitude, longitude and clock temporal bias. There are three base stations, namely BS1, BS2 and BS3, and three associated distance measurements. Circles are plotted centered at a particular base station, with radii given by the sum of the distance between the mobile station and the base station as measured at the mobile station, and the computed clock temporal bias corresponding to a fitting solution. Given three independent distance measurements, there are two possible location determination solutions, depicted at the intersection of each set of circles.

Second, the nature of the algorithm used for locating a user can also be a source of ambiguity. A well known algorithm that is susceptible to ambiguity is described in the U.S. Pat. No. 6,289,280. This algorithm solves for unknowns using a closed form system of equations. Because it solves for the user location algebraically, this algorithm runs efficiently, making it suitable to applications and devices with time or resource constraints. The solution uses linear algebra manipulations to combine the measurements into a system of quadratic equations where the number of equations equals the number of unknowns. Two solutions are produced associated with the two roots of the quadratic equations. The two solutions form an ambiguous set of solutions which needs to be resolved by additional means.

For example, consider the case where the unknowns are the two-dimensional user spatial coordinates and user clock temporal bias. With four measurements, the system can be said to have a sufficient number of measurements to unambiguously solve for the user location. Yet, when the algebraic method is used, the four measurements are combined into three "average" measurements and two solutions corresponding to these averages are identified, as shown in FIG. 2.

Third, noisy measurements can lead to error in the determination of user location. Consider a method for location determination in noisy environments by assuming the noise to be a discrete variable with known or computable statistical parameters. A set of adjusted measurements and corresponding solution are generated for each assumed noise level. Such location determination system is ambiguous, thus also warranting ambiguity resolution techniques. For example, in FIG. 3, consider three noise levels, each 100 meters apart, associated with the measurement from base station BS2. For each noise level, a set of circles is plotted as before, with a radius corresponding to the sum of distance measurement (in the case of BS2, this measurement is adjusted by the assumed noise level) and the clock temporal bias computed. There are three ambiguous solutions, associated with each noise level, shown by the intersection of circles.

Accordingly, since more than one possible solution is presented by these prior art algorithms, it would be desirable to provide a method for selecting the correct (a.k.a. final) location determination solution from a set of ambiguous location determination solutions.

SUMMARY

Disclosed are methods for selecting the correct (a.k.a. final) location determination solution from a set of ambiguous location determination solutions using various heuristics and/or noise removal.

According to one aspect, a method for resolving ambiguity in location determination with N ambiguous location determination solutions using clock temporal bias value includes the following steps: generating a probability distribution function (PDF) model for clock temporal bias, obtaining N clock temporal bias values for the N ambiguous location determination solutions, inserting each of the N clock temporal bias values into the PDF model, evaluating the PDF model to get N PDF values, setting N goodness metrics to the N PDF values, comparing the N goodness metrics, defining a maximum goodness metric as the largest of the N goodness metrics, and selecting a final location determination solution having the maximum goodness metric.

According to another aspect, a method for resolving ambiguity in location determination with a plurality of ambiguous location determination solutions using the order of receipt (a.k.a. time of arrival) of a plurality of ranging signals includes the following steps: ranking the plurality of ranging signals based on the order of actual time of arrival (TOA) from earliest to latest, ranking the plurality of ranging signals based on an expected order of time of arrival corresponding to each of the plurality of ambiguous location determination solutions, and comparing the ranking of the ranging signals based on the order of the actual time of arrival (TOA) and based on the expected order of time of arrival corresponding to each of the plurality of ambiguous location determination solutions.

According to yet another one aspect, a method for resolving ambiguity in location determination with a plurality of ambiguous location determination solutions using the order of received power levels of a plurality of ranging signals includes the following steps: ranking the plurality of ranging signals based on the order of received power levels from strongest to weakest, ranking the plurality of ranging signals based on an expected order of received power levels corresponding to each of the plurality of ambiguous location determination solutions, and comparing the ranking of the ranging signals based on the order of received power levels and based on the expected order of received power levels corresponding to each of the plurality of ambiguous location determination solutions.

According to still another aspect, a method for resolving ambiguity in location determination with a plurality of ambiguous location determination solutions includes the following steps: deriving a plurality of distances D1 corresponding to each of the plurality of ambiguous location determination solutions for each of M sources, obtaining a plurality of original distances D2, comparing each of the plurality of distances D1 with each of its corresponding plurality of original distances D2 and computing a plurality of error measurements, and selecting a final location determination solution as having the lowest value of the plurality of error measurements.

According to yet another aspect, a method for resolving ambiguity in location determination in a noisy environment includes the following steps: selecting L noise levels iteratively within a range [A, B] with an increment I for a first of Q ranging signals, repeating the selecting step Q minus 1 times for each of the rest of the Q ranging signals to produce a plurality of L noise levels, creating a plurality of ambiguous location determination solutions for each of the plurality of L noise levels based on a geometric technique, selecting the final location determination solution from the plurality of ambiguous location determination solutions based on a discriminator function.

It is understood that other embodiments will become readily apparent to those skilled in the art from the following detailed description, wherein it is shown and described various embodiments by way of illustration. The drawings and detailed description are to be regarded as illustrative in nature and not as restrictive.

DETAILED DESCRIPTION

Figure 1:
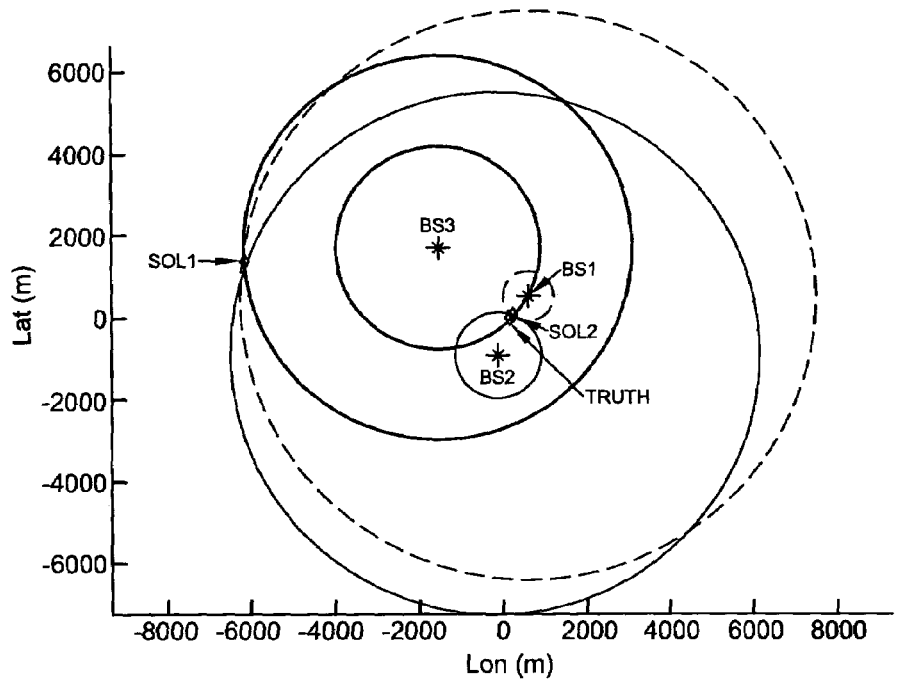
FIG. 1 graphically illustrates an example of three measurements with unknown user spatial coordinates and clock temporal bias value with two ambiguous location determination solutions.
Figure 2:
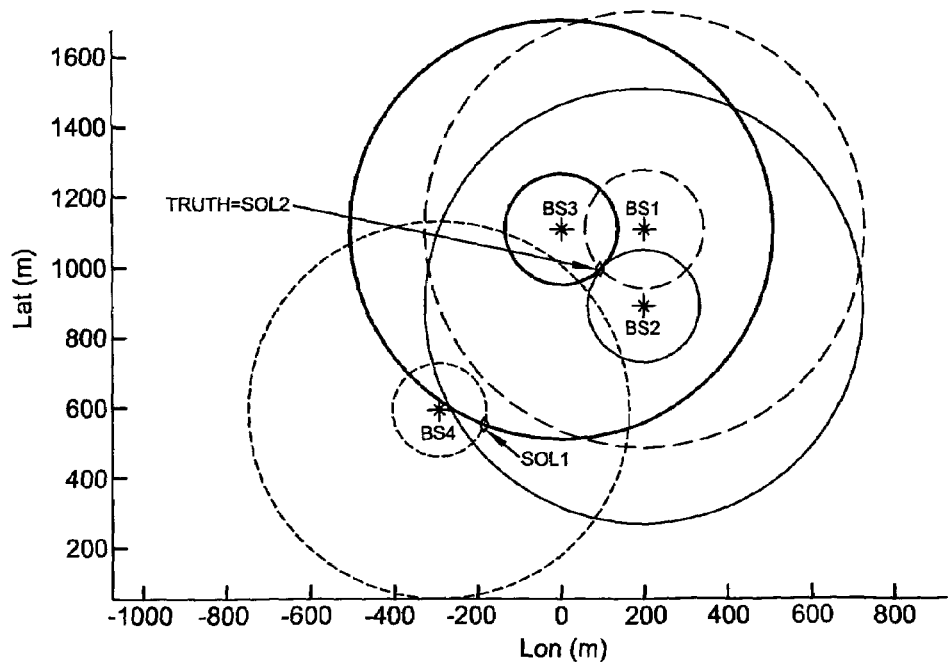
FIG. 2 graphically illustrates an example of four measurements with three unknowns with two ambiguous location determination solutions.
Figure 3:
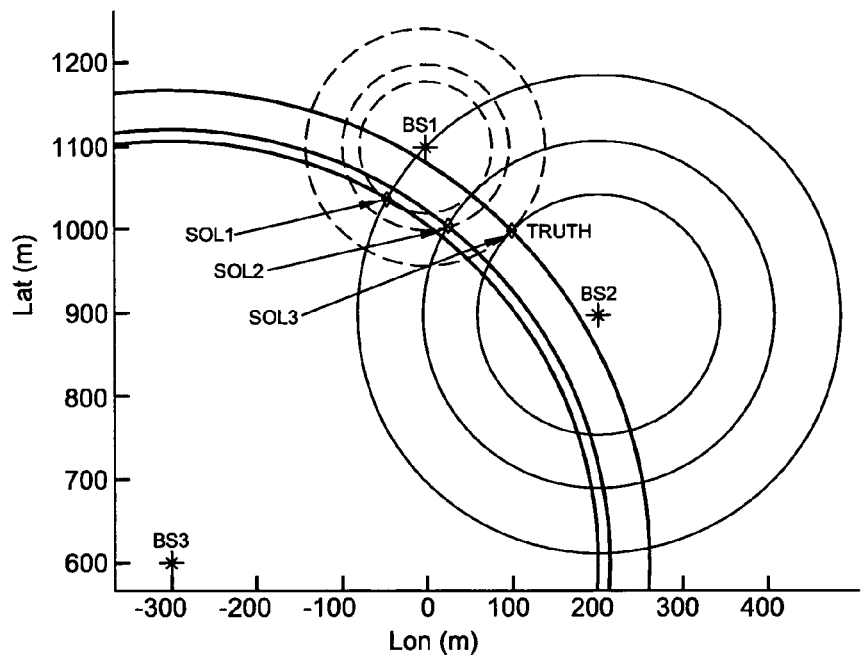
FIG. 3 graphically illustrates an example of noisy measurements with three ambiguous location determination solutions.

The description set forth below in connection with the appended drawings is intended as a description of various embodiments of the invention and is not intended to represent the only embodiments in which the invention may be practiced. Each embodiment is provided merely as an example or illustration, and should not necessarily be construed as preferred or advantageous over other embodiments. Specific details are used to provide an understanding of the invention. However, it will be apparent to those skilled in the art that the invention may be practiced without these specific details. Acronyms and other descriptive terminology may be used merely for convenience and clarity and are not intended to limit the scope of the invention.

Various heuristic approaches for ambiguity resolution are disclosed that exploit known or expected behavior of one or more unknowns or combinations thereof, consistency of various quantifiable parameters, and/or redundancy from measurements or different parameters within a measurement. A main advantage of the heuristic approaches disclosed is that redundant measurements are not required for the purpose of location determination solution disambiguation.

For the purpose of illustration only, simulations using real user data from Manhattan, Japan, and Campbell are presented. The Manhattan database consists of 1316 fixes from about 25 locations across the city, with about 20 to 100 position fixes per location. The Japan dataset consists of about 1912 fixes from all over Japan. The Campbell dataset consists of a stationary location with about 2000 fixes.

In one embodiment, the method for ambiguity resolution uses physical constraints on the behavior of some of the unknowns and combinations thereof. In particular, asynchronous systems can benefit from a set of assumptions or information concerning clock temporal bias value, which can be exploited to disambiguate the user location. In a system where the user clock timing is learned from some reference timing signal, user clock temporal bias value may include the time the reference timing signal takes to propagate from the source of the reference timing signal to the user, some multipath and receiver processing overhead and clock slewing error. A probability distribution function (PDF) of clock temporal bias value can be derived for that network and used to disambiguate the user location.

User clock temporal bias values may be characterized by known statistical distributions, with distribution parameters dictated by various factors, such as the receiver design, the user clock design characteristics, multipath characteristics, and, in a terrestrial system, by network deployment issues such as base station density. The distribution parameters may be set statically or learned dynamically for a given location system. The goodness metric of a final location determination solution can be derived from the value of the computed clock temporal bias value and the probability distribution function (PDF) of clock temporal bias value for that scenario.

To determine the final location determination solution from a set of N ambiguous location determination solutions using N clock temporal bias values, the following steps are needed: First, generate a probability distribution function (PDF) model for the N clock temporal bias values. In one embodiment, the PDF model is parameterized by its mean and standard deviation. Second, for each of the N ambiguous location determination solutions, obtain a clock temporal bias value, resulting in N clock temporal bias value. Third, for each of the ambiguous location determination solutions, insert its corresponding clock temporal bias value into the PDF model. Fourth, for each of the ambiguous location determination solutions, evaluate the PDF model at the inserted clock temporal bias value to get a PDF value. The result should be N PDF values for the N clock temporal bias values. Fifth, for each of the ambiguous location determination solutions, set the goodness metric of the ambiguous location determination solution to the PDF value. Again, there should be N goodness metrics corresponding to the N PDF values which correspond to the N clock temporal bias values. Sixth, compare the N goodness metrics and defined a maximum goodness metric as the largest of the N goodness metrics. Seventh, select the final location determination solution from the ambiguous location determination solution with the maximum goodness metric. The quantity N is defined as an integer greater than one.

In one embodiment, clock temporal bias value is modeled to follow a Gaussian probability distribution function (PDF) with a mean and standard deviation of minus 100 meters and 100 meters respectively. If the computed clock temporal bias value (multiplied by the speed of light) is minus 200 meters, then goodness metric can be set to the value of the Gaussian probability distribution function one standard deviation away from the mean. One skilled in the art would know that other PDFs other than a Gaussian PDF (for example, a finite set of statistical parameters) may be used.

Figure 4:
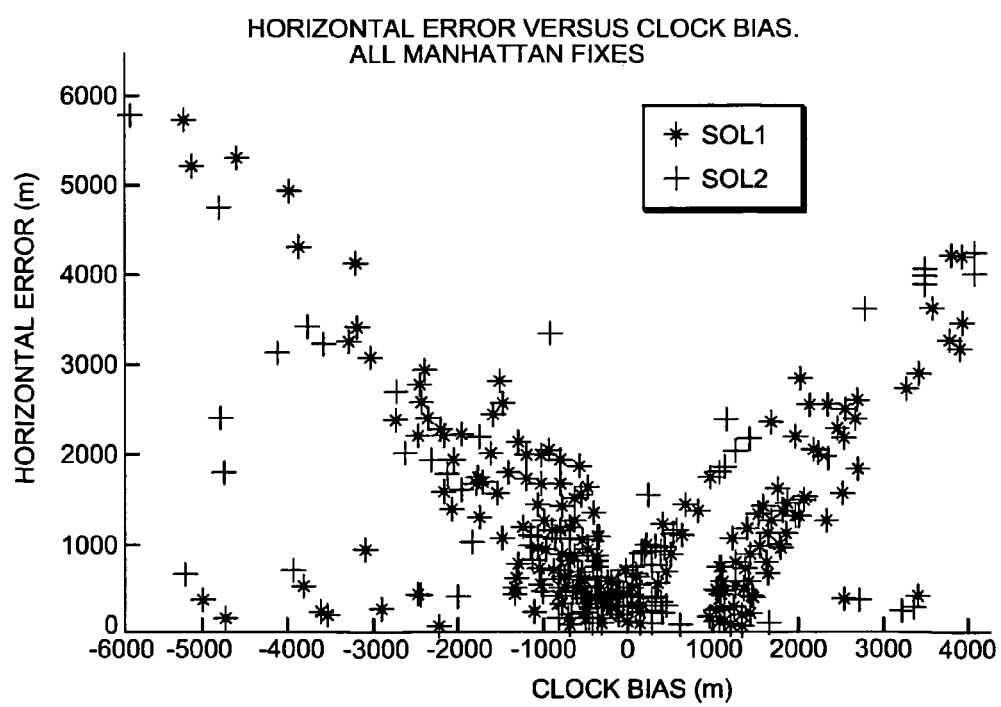
FIG. 4 graphically illustrates the relationship between the clock temporal bias value and the horizontal error for each of the ambiguous location determination solutions for the Manhattan dataset.
Figure 5:
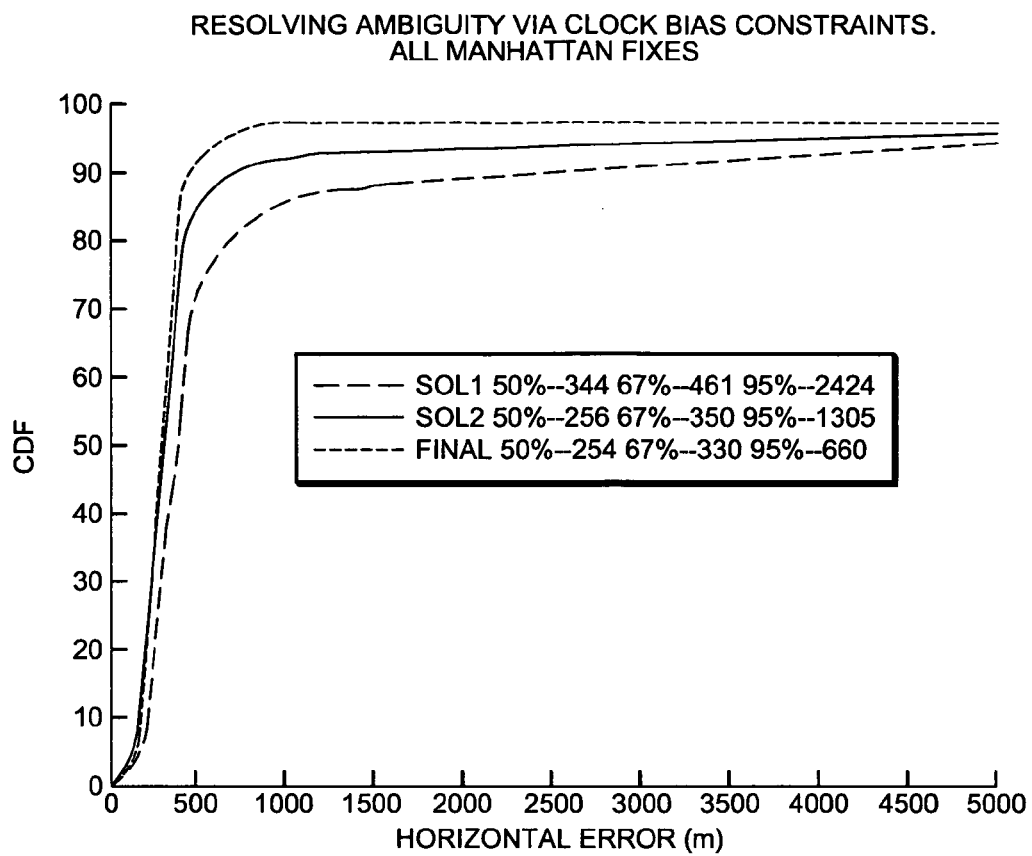
FIG. 5 graphically illustrates the statistical performance of the two ambiguous location determination solutions (solution #1 and solution #2) and the chosen final location determination solution by resolving ambiguity through clock temporal bias value constraints and is plotted as a cumulative distribution function (CDF) of the horizontal errors in meters for the Manhattan dataset.
Figure 6A:
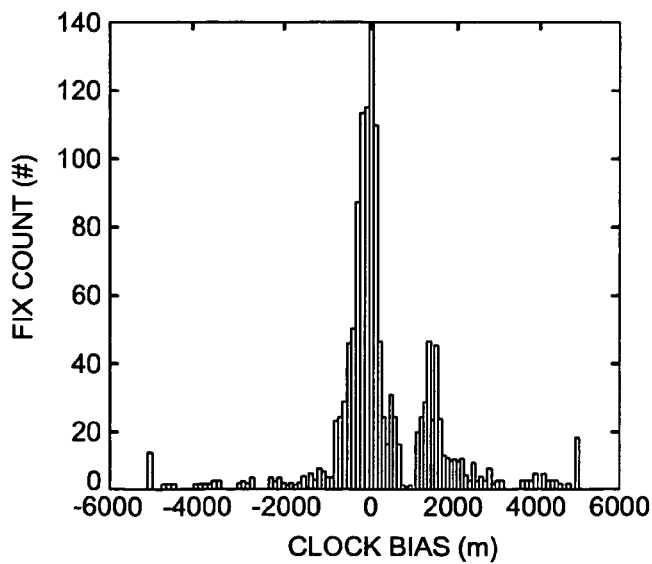
FIG. 6 graphically illustrates the histogram of the clock temporal bias produced by each of the two ambiguous location determination solutions (solution #1 and solution #2) for the Manhattan dataset.
Figure 6B:
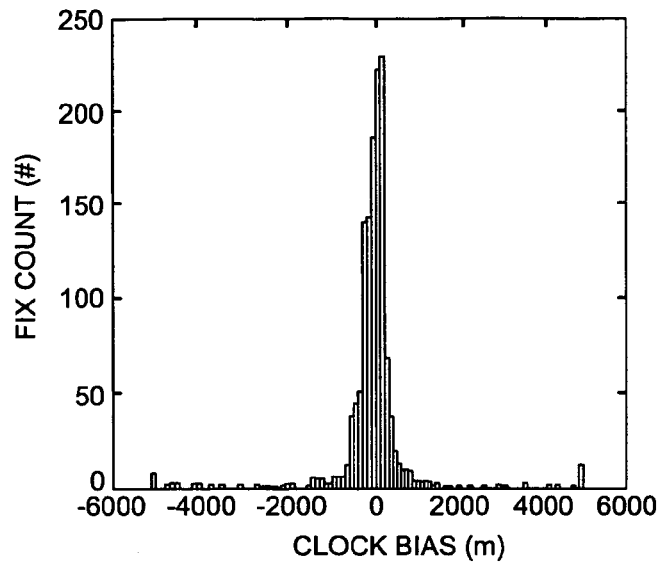

In an example, clock temporal bias value is assumed to have a static, simple uniform distribution, with permissible clock temporal bias value between some value A and another value B. For Manhattan and Campbell datasets, A and B are set to minus 1000 meter and 1000 meters respectively. In the case of Japan, A and B are set to minus 2000 meters and 100 meters to better suit the Japan dataset as observed empirically. For the Manhattan dataset, the relationship between clock temporal bias value and the horizontal error of each ambiguous location determination solution is shown in FIG. 4. For large errors, it is observed that there is a strong, generally linear dependence of error on clock temporal bias value. For the Manhattan dataset, the performance results are shown in FIG. 5. It is observed that the disambiguation algorithm works well in that the final location determination solution statistically outperforms either of the two ambiguous location determination solutions across the entire dataset. It is noted that the ambiguous location determination solution labeled "Solution 2" generally outperforms the ambiguous location determination solution labeled as "Solution 1". Such discrepancy is apparent and explainable by the behavior of clock temporal bias value as produced by each ambiguous location determination solution, and shown in FIG. 6. One can see how the second ambiguous location determination solution has a "tight" distribution while the first ambiguous location determination solution produced highly-varying results.

Figure 7:
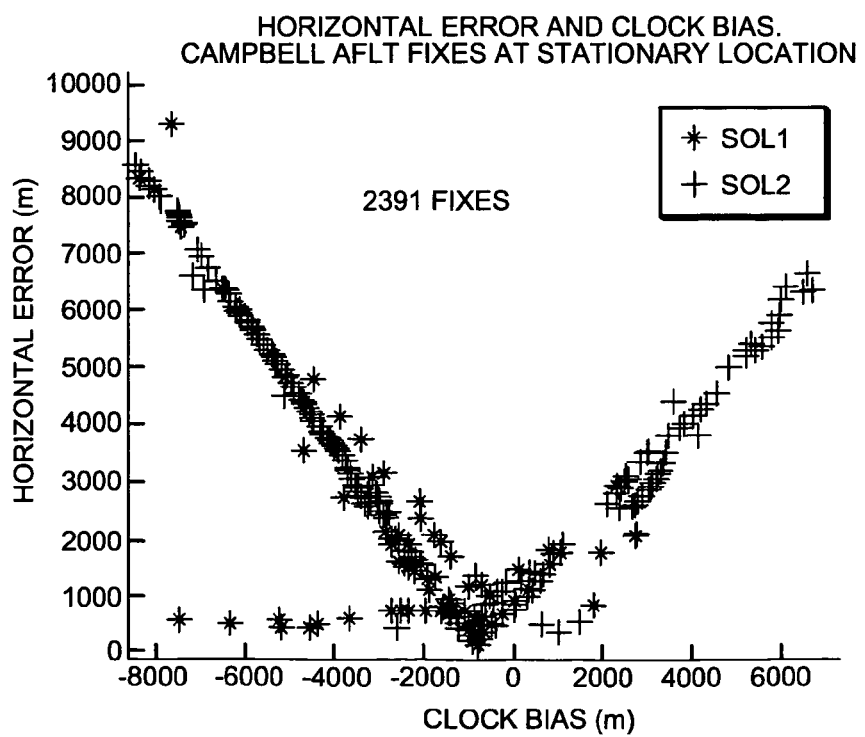
FIG. 7 graphically illustrates the relationship between the clock temporal bias value and the horizontal error for each of the ambiguous location determination solutions for the Campbell dataset.
Figure 8:
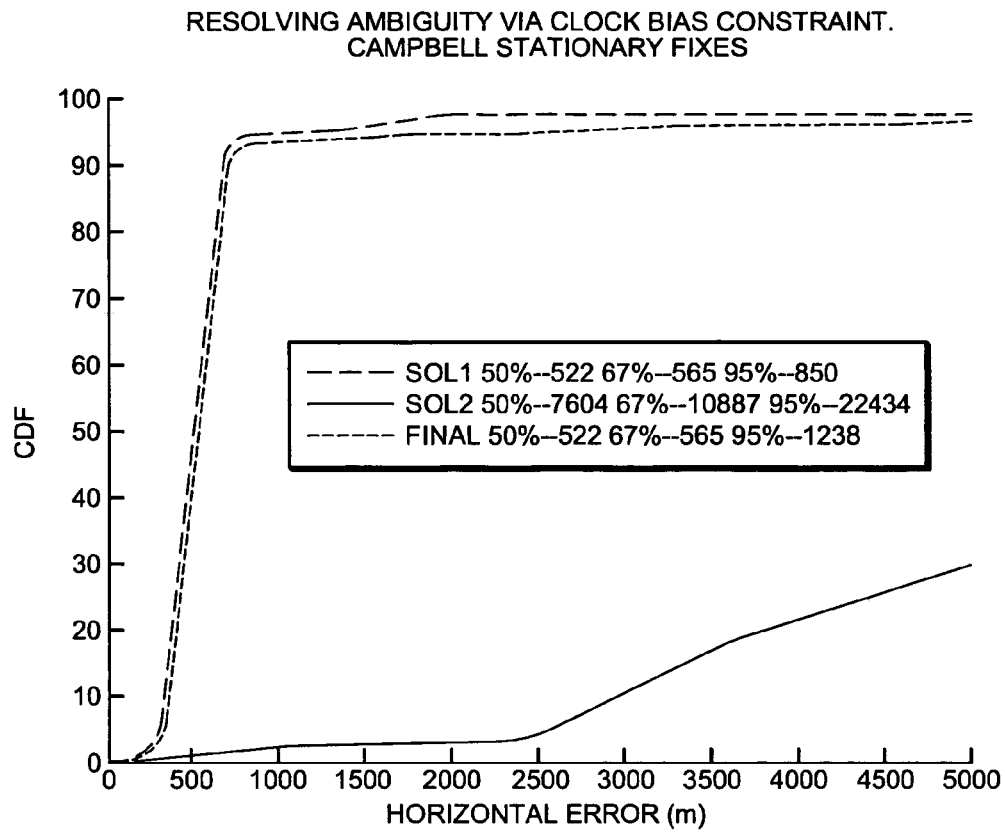
FIG. 8 graphically illustrates the statistical performance of the two ambiguous location determination solutions (solution #1 and solution #2) and the chosen final location determination solution by resolving ambiguity through clock temporal bias value constraints and is plotted as a cumulative distribution function (CDF) of the horizontal errors in meters for the Campbell dataset.
Figure 9:
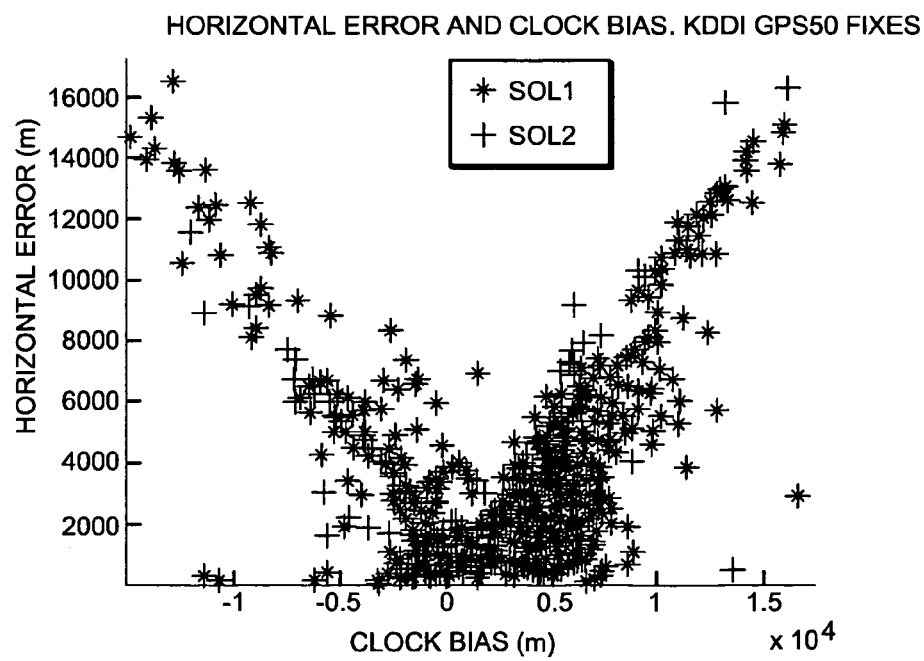
FIG. 9 graphically illustrates the relationship between the clock temporal bias value and the horizontal error for each of the ambiguous location determination solutions for the Japan dataset.
Figure 10:
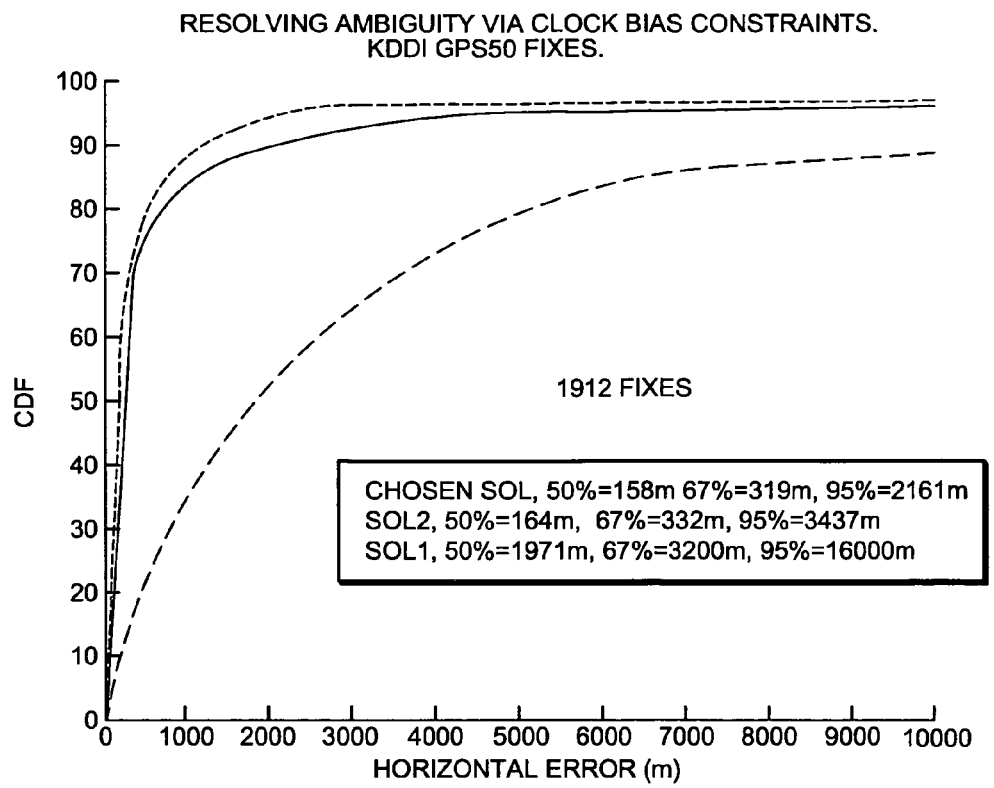
FIG. 10 graphically illustrates the statistical performance of the two ambiguous location determination solutions (solution #1 and solution #2) and the chosen final location determination solution by resolving ambiguity through clock temporal bias value constraints and is plotted as a cumulative distribution function (CDF) of the horizontal errors in meters for the Japan dataset.

FIG. 7 graphically illustrates the relationship between the clock temporal bias value and the horizontal error for each of the ambiguous location determination solutions for the Campbell dataset. FIG. 8 graphically illustrates the statistical performance of the two ambiguous location determination solutions (solution #1 and solution #2) and the chosen final location determination solution plotted as a cumulative distribution function (CDF) of the horizontal errors in meters for the Campbell dataset. For the Japan dataset, FIG. 9 graphically illustrates the relationship between the clock temporal bias value and the horizontal error for each of the ambiguous location determination solutions while FIG. 10 graphically illustrates the statistical performance of the two ambiguous location determination solutions (solution #1 and solution #2)

and the chosen final location determination solution plotted as a cumulative distribution function (CDF) of the horizontal errors in meters.

Alternative methods for ambiguity resolution use consistency of ranging signal order. There are various ways for deriving ranging signal order, such as the time of arrival (TOA) of ranging signals and/or the power level of ranging signals In one embodiment, the method for ambiguity resolution uses the order of receipt (a.k.a. time of arrival) of ranging signals from a plurality of sources to resolve ambiguity. The expected order corresponding to each solution is derived and compared to the actual order in which the ranging signals are received. The chosen final location determination solution is the one with the closest match in ordering, or a combination of a number of ambiguous location determination solutions with the closest match in ordering.

To determine the final location determination solution from a set of ambiguous location determination solutions using the order of receipt (a.k.a. time of arrival) of ranging signals, the following steps are needed: First, rank the ranging signals based on the order of actual time of arrival (TOA) from earliest to latest. Second, for each of the ambiguous location determination solution, rank the ranging signals based on the expected order of time of arrival corresponding to each ambiguous location determination solution. Third, compare the ranking of the ranging signals in the order of the actual time of arrival (TOA) from earliest to latest to the ranking of the ranging signals based on the expected order of arrival corresponding to each ambiguous location determination solution. Fourth, select the final location determination solution as the one with the closest match in ordering, or a combination of a number of ambiguous location determination solutions with the closest match in ordering.

Figure 11:
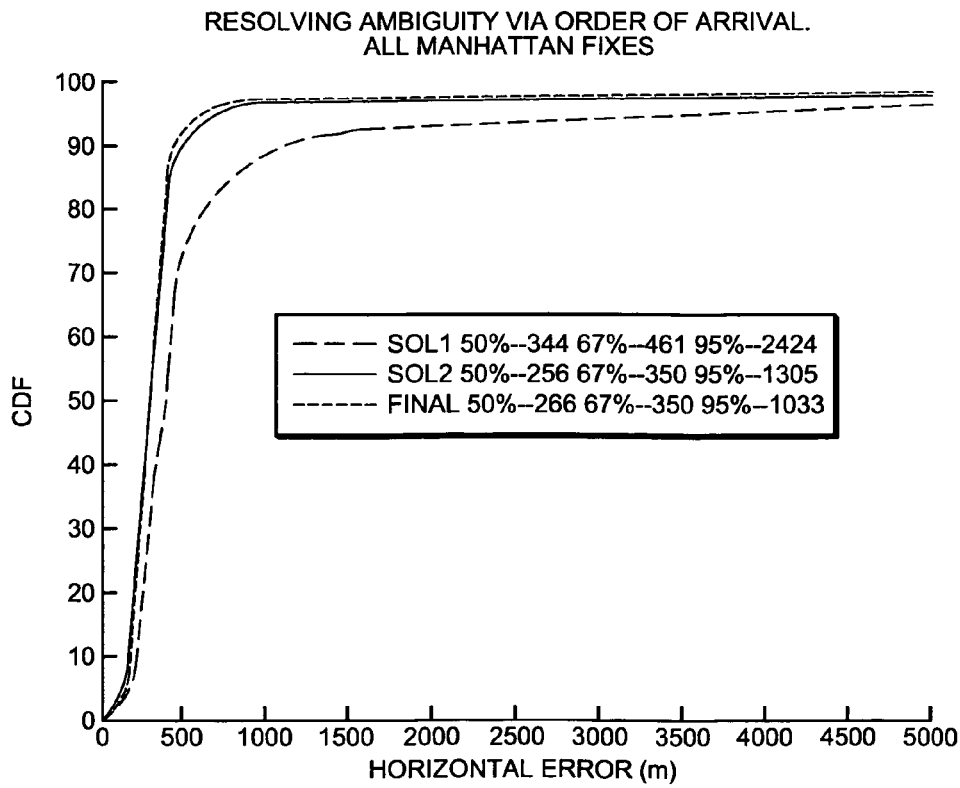
FIG. 11 graphically illustrates the statistical performance of the two ambiguous location determination solutions (solution #1 and solution #2) and the chosen final location determination solution by resolving ambiguity through consistency in order of ranging signal arrival and is plotted as a cumulative distribution function (CDF) of the horizontal errors in meters for the Manhattan dataset.
Figure 12:
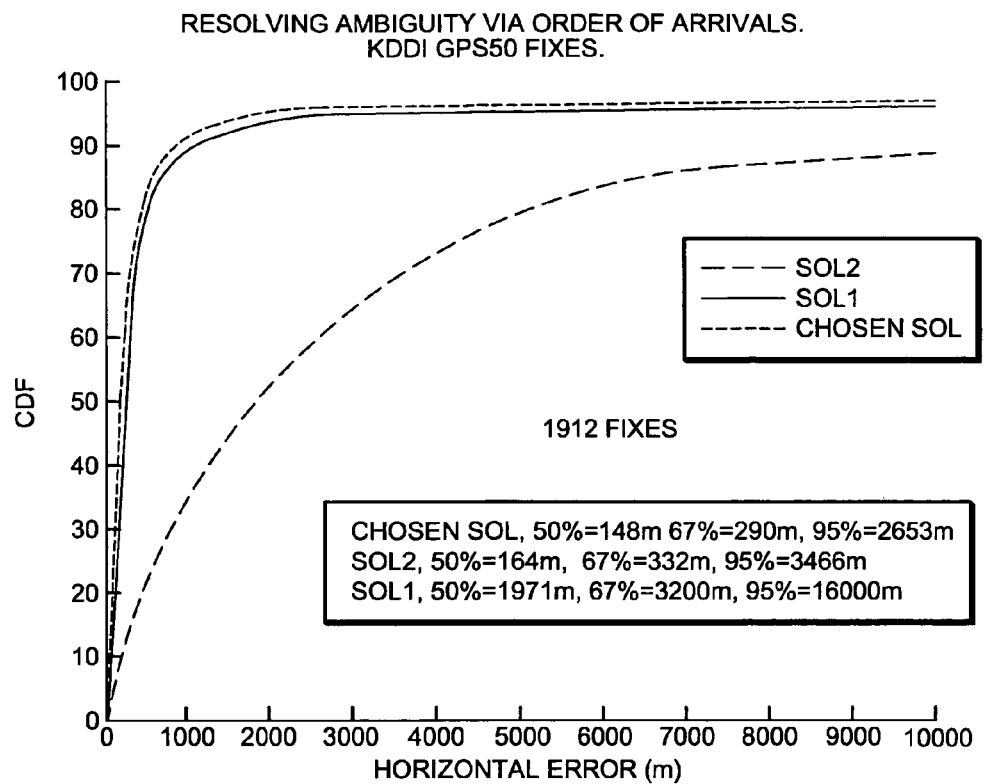
FIG. 12 graphically illustrates the statistical performance of the two ambiguous location determination solutions (solution #1 and solution #2) and the chosen final location determination solution by resolving ambiguity through consistency in order of ranging signal arrival and is plotted as a cumulative distribution function (CDF) of the horizontal errors in meters for the Japan dataset.

In an example, the a-posteriori ranging signal order is compared to the a-priori ranging signal order derived from the time-of-arrival (TOA) information. For each ranging signal, its rankings in the a-priori and a-posteriori lists are compared and labeled a "1" in case of a match and a "0" in case of a mismatch. The solution with the most matches (i.e., the most "1"s) across all ranging signals is picked as the location determination solution. In case of a tie, the average is used. The results for this disambiguation technique applied to the Manhattan dataset are shown in FIG. 11 and for the Japan dataset are shown in FIG. 12. In general, the final location determination solution fares similarly or statistically outperforms either of the two ambiguous location determination solutions.

In another embodiment, the method for ambiguity resolution uses the received power level of ranging signals to discriminate among ambiguous location determination solutions. One can use received power level to discriminate among location determination solutions. To determine the final location determination solution from a set of ambiguous location determination solutions using the received power levels of the ranging signals, the following steps are needed: First, rank the ranging signals based on the order of the received power level received, from strongest to weakest. Second, for each of the ambiguous location determination solution, rank the ranging signals based on the expected order of the received power levels corresponding to each ambiguous location determination solution. The expected order of the received power levels is assumed to be the same as the expected order of the time of arrival corresponding to each ambiguous location determination solution. Third, compare the ranking of the ranging signals in the order of the received power level received from strongest to weakest to the ranking of the ranging signals based on the expected order of the received power levels corresponding to each ambiguous location determination solution. Fourth, select the final location determination solution as the one with the closest match in ordering, or a combination of a number of ambiguous location determination solutions with the closest match in ordering.

Figure 13:
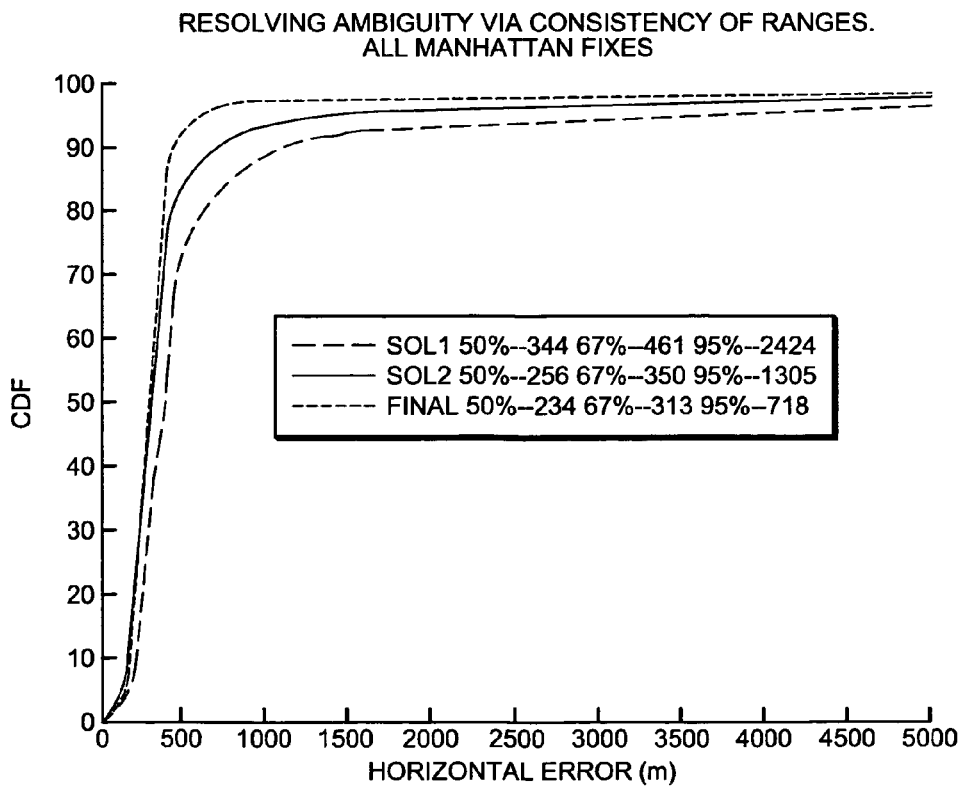
FIG. 13 graphically illustrates the statistical performance of the two ambiguous location determination solutions (solution #1 and solution #2) and the chosen final location determination solution by resolving ambiguity through consistency of distance values and is plotted as a cumulative distribution function (CDF) of the horizontal errors in meters for the Manhattan dataset.
Figure 14:
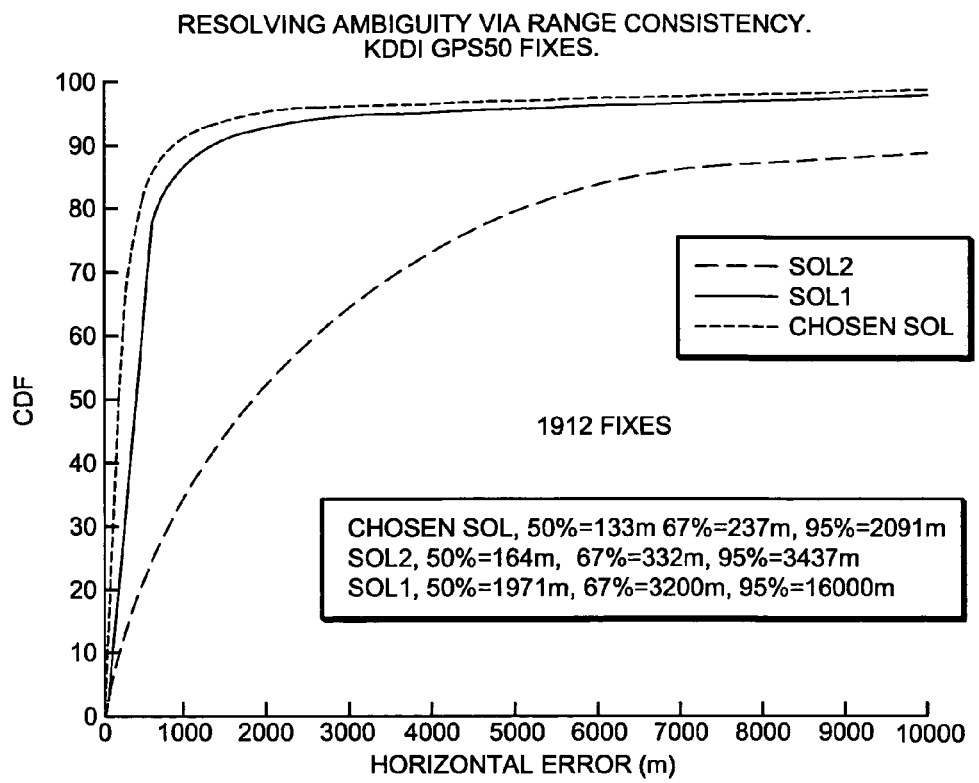
FIG. 14 graphically illustrates the statistical performance of the two ambiguous location determination solutions (solution #1 and solution #2) and the chosen final location determination solution by resolving ambiguity through consistency of distance values and is plotted as a cumulative distribution function (CDF) of the horizontal errors in meters for the Japan dataset.

In another embodiment, the method for ambiguity resolution uses the numerical values of the distances to M sources and combinations thereof to resolve ambiguity. One can derive each of the distance D1 to each of the M sources corresponding to each ambiguous location determination solution and compare them to the original distance adjusted by the clock temporal bias value (labeled as original distance D2). The quantity of sources is defined as M whereby M is an integer greater than one. The ambiguous location determination solution with the closest match (as defined by the root-mean-square of D1 minus D2 or by the mean square of D1 minus D2), or some combination of a number of values with the closest matches is chosen as the final location determination solution. It will be understood by one skilled in the art that the present invention is not confined to the root-mean-square or mean-square of D1 minus D2 and that other error measures such as, but not limited to, root-sum-square (RSS) or sum-square (SS) may also be used without violating the spirit of the invention. The results for the Manhattan and Japan dataset are shown in FIG. 13 and FIG. 14 respectively. In both cases, the final location determination solution statistically outperforms either of the two ambiguous location determination solutions across the entire dataset.

To determine the final location determination solution from a set of ambiguous location determination solutions using numerical values of the distances to the M sources, the following steps are needed: First, for each of the M sources, derive the distance D1 corresponding to each ambiguous location determination solution. Second, obtain the original distance D2 (which is the original distance adjusted by clock temporal bias value). Third, compare the distance D1 with the original distance D2 and compute their error measurement. In one embodiment, the error measurement is the root-mean-square of D1–D2. In another embodiment, the error measurement is the root-sum-square of D1–D2. And, in yet another embodiment, the error measurement is the root-mean-square of D1–D2 normalized by the size of the vector D1 (or D2). Fourth, select the final location determination solution as having the lowest value of error measurement.

Noisy measurements can also lead to errors in location determination. Out of a set of P signals, a subset of Q signals is selected by some method so that the algorithm may run efficiently. The selection method may select the Q signals randomly or via a more systematic method, such as choosing those signals with the lowest power level (that are more likely to incur noise overhead). For each of the Q signals selected, L noise levels are postulated. The location determination solutions correspond to each of L times Q combinations of noise levels. A method for noise disambiguation involves the following steps. First, for the first of the Q ranging signals, select L noise levels iteratively within a range [A, B] with an increment I. One skilled in the art would know the range [A, B] and the increment I (and hence, the quantity of L) based on the chosen location determination system. Second, repeat the above step Q minus 1 times for each of the rest of the Q minus 1 ranging signals to produce a plurality of L noise levels. Third, create a plurality of ambiguous location determination solutions for each of the plurality of noise levels based on known geometric techniques such as trilateration. Fourth, a discriminator function, known to one skilled in the art, is used to select the final location determination solution from the plurality of ambiguous location determination solutions produced for each of the plurality of noise levels. The discriminator function can use one or a combination of goodness metrics such as power ranking, distance values, clock temporal bias constraints, order of receipt of the ranging signals. In one embodiment, the discriminator function jointly maximizes the consistency of power ranking and distance values, while meeting the clock temporal bias constraint. Other discriminator functions are known to one skilled in the art and may be used without departing from the spirit of the present invention.

Figure 15:
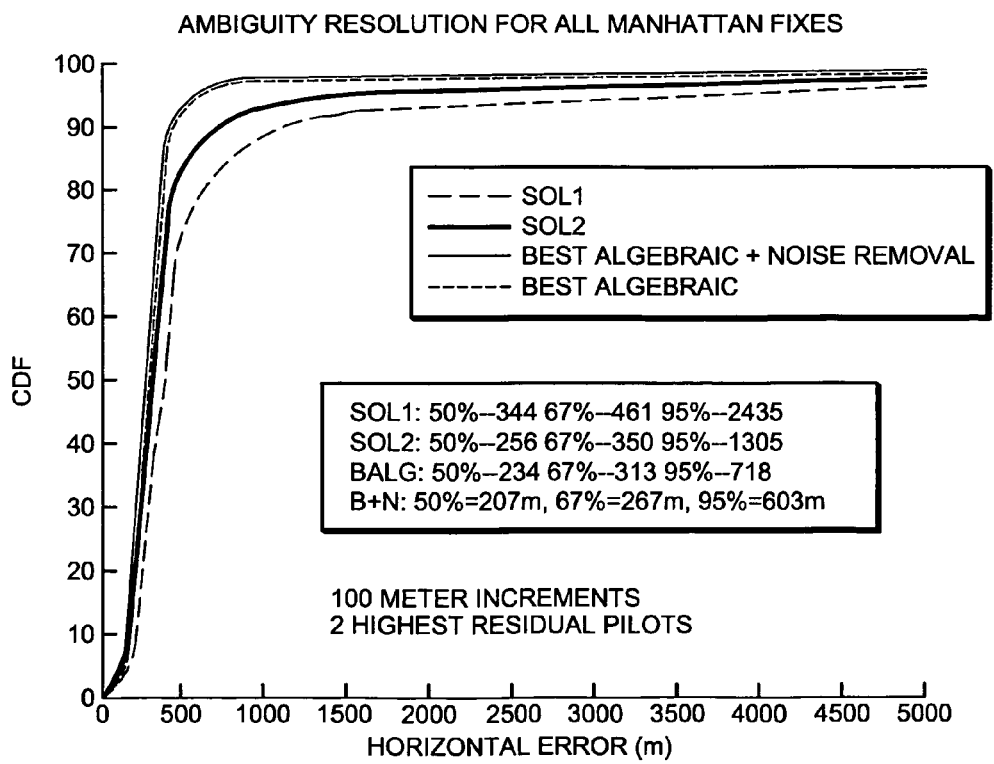
FIG. 15 graphically illustrates the statistical performance of the two ambiguous location determination solutions (solution #1 and solution #2) with the best ambiguous location determination solutions with and without noise removal and are plotted as a cumulative distribution function (CDF) of the horizontal errors in meters for the Manhattan dataset.

In an example, the noise removal techniques for fixes in the Manhattan dataset. N, A, B are set to 2, 0, and 500 meters respectively. The increment I values is investigated in the set of {100 meters, 50 meters}. Disambiguation among solutions is done by means of a combination of power ranking, range consistency and clock temporal bias value. The power ranking algorithm works as follows: Using the power level of incoming ranging signals, the a-priori order of ranging signals is computed. Then, for each solution corresponding to a noise setting, the a-posteriori order of ranging signals is computed using geographical distances. The a-priori and a-posteriori orders are compared for a given ranging signal. Its ranking in the a-priori and a-posteriori lists are compared and a match is labeled a "1" while a mismatch returns a "0." The power ranking is computed as the sum of matches across all ranging signals, weighted for each ranging signal in the following way: if the ranging signal is the first ranging signal in the a-priori list (that is, for the base station which is assumed closest), then the weight is ½. Otherwise, the weight is 0.5 times (the number of ranging signals −1). Note the weights are normalized, as they add up to 1. Also, the bias in the weighting allows the strongest ranging signal to be more heavily weighted which has been shown to give improved results. The root-mean-square differences in the a-priori and a-posteriori ranges (RRMS) are also computed for each solution. Range consistency is calculated as 1−RRMS/max (RRMS). The clock temporal bias value enforces a [−1000 meters to 1000 meters] range on the accepted solutions. The final location determination solution is the one that meets the clock temporal bias value constraint while maximizing the product of the power ranking and range consistency. The results are shown in FIG. 15. It is noted that an improvement is observed over the best algebraic method.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention.

What is claimed is:

1. A method for resolving ambiguity in location determination with a number, N, of ambiguous location determination solutions using clock temporal bias value comprising:
generating a probability distribution function (PDF) model for clock temporal bias;
obtaining N clock temporal bias values of a clock within a mobile station receiver for the N ambiguous location determination solutions, wherein at least one of the N ambiguous location determination solutions is an ambiguous solution due to presence of noisy measurements;
inserting each of the N clock temporal bias values into the PDF model;
evaluating the PDF model to get N PDF values;
setting N goodness metrics to the N PDF values;
comparing the N goodness metrics;
defining a maximum goodness metric as the largest of the N goodness metrics; and
determining a final location determination solution by selecting a one of the N ambiguous location determination solutions having the maximum goodness metric.

2. The method of claim 1 wherein the PDF model is parameterized by its mean and standard deviation.

3. The method of claim 1 wherein the PDF model is parameter zed by a finite set of statistical parameters.

4. The method of claim 1 wherein N equals 2.

5. The method of claim 1, wherein a further one of the N ambiguous location determination solutions includes position ambiguity introduced by a property of an algorithm for which further one of the N ambiguous location determination solutions is based.

6. The method of claim 1, wherein a further one of the N ambiguous location determination solutions includes position ambiguity introduced by insufficient, measurements.

7. Computer readable media embodying a program of instructions executable by a computer to perform a method for resolving ambiguity in location determination with a number, N, of ambiguous location determination solutions using clock temporal bias value, the method comprising:
generating a probability distribution function (PDF) model for clock temporal bias;
obtaining N clock temporal bias values of a clock within a mobile station receiver for the N ambiguous location determination solutions, wherein at least one of the N ambiguous location determination solutions is an ambiguous solution due to presence of noisy measurements;
inserting each of the N clock temporal bias values into the PDF model;
evaluating the PDF model to get N PDF values;
setting N goodness metrics to the N PDF values;
comparing the N goodness metrics;
defining a maximum goodness metric as the largest of the N goodness metrics; and
determining a final location determination solution by selecting a one of the N ambiguous location determination solutions having the maximum goodness metric.

8. The computer readable media of claim 7 wherein the PDF model is parameterized by its mean and standard deviation.

9. The computer readable media of claim 7 wherein the PDF model is parameterized by a finite set of statistical parameters.

10. The computer readable media of claim 7 wherein N equals 2.

11. A method for resolving ambiguity in location determination with a number, N, of ambiguous location determination solutions using clock temporal bias value comprising:
obtaining N clock temporal bias values of a clock within a mobile station receiver for the N ambiguous location determination solutions, wherein a subset of the N ambiguous location determination solutions represent ambiguous location solutions due to presence of noisy measurements in each of the subset of the N ambiguous location determination solutions;
determining a plurality of goodness metrics based on the N clock temporal bias values and a probability distribution function (PDF) model for clock temporal bias; and
determining a final location determination solution from the N ambiguous location determination solutions based on a maximum goodness metric.

12. The method of claim 11, wherein determining the plurality of goodness metrics comprises:
   inserting each of the N clock temporal bias values into the PDF model;
   evaluating the PDF model to obtain N PDF values; and
   determining N goodness metrics based on the N PDF values.

13. The method of claim 11 wherein the PDF model is parameterized by its mean and standard deviation.

14. The method of claim 11 wherein the PDF model is parameterized by a finite set of statistical parameters.

15. The method of claim 11 wherein N equals 2.

16. A method for resolving ambiguity in location determination with a number, N, of ambiguous location determination solutions using clock temporal bias value comprising:
   obtaining the number, N, of ambiguous location determination solutions, wherein a location ambiguity for each of the N ambiguous location determination solutions is due to at least one of insufficient measurements or presence of noisy measurements;
   obtaining a probability distribution function (PDF) model for clock temporal bias;
   obtaining a clock temporal bias value of a clock within a mobile station receiver for each of the number, N, of ambiguous location determination solutions;
   inserting each of the clock temporal bias values into the PDF model to obtain a PDF value for each of the clock temporal bias values;
   selecting a location determination solution associated with a maximum PDF value.

17. The method of claim 16, wherein the number N is an integer greater than or equal to two.

* * * * *